(12) United States Patent
Baronian et al.

(10) Patent No.: US 11,439,014 B2
(45) Date of Patent: Sep. 6, 2022

(54) SOLID STATE CIRCUIT BREAKER ASSEMBLY

(71) Applicant: Eaton Intelligent Power Limited, Dublin (IE)

(72) Inventors: Armen Baronian, Toronto (CA); Mikhail Goykhman, Reseda, CA (US); Galen Chui, Ladera Ranch, CA (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/937,894

(22) Filed: Jul. 24, 2020

(65) Prior Publication Data

US 2021/0029828 A1 Jan. 28, 2021

Related U.S. Application Data

(60) Provisional application No. 62/878,969, filed on Jul. 26, 2019.

(51) Int. Cl.
*H05K 5/00* (2006.01)
*H05K 1/18* (2006.01)
*H05K 3/30* (2006.01)
*H05K 7/02* (2006.01)
*H05K 9/00* (2006.01)

(52) U.S. Cl.
CPC .......... *H05K 1/18* (2013.01); *H05K 3/30* (2013.01); *H05K 7/023* (2013.01); *H05K 9/0007* (2013.01); *H05K 2201/09027* (2013.01); *H05K 2201/10166* (2013.01); *H05K 2201/10174* (2013.01); *H05K 2201/10196* (2013.01); *H05K 2201/10522* (2013.01); *H05K 2201/10545* (2013.01)

(58) Field of Classification Search
CPC ...... H05K 1/18; H05K 3/30; H05K 7/023; H05K 9/0007
USPC ........................................................ 361/732
See application file for complete search history.

(56) References Cited

U.S. PATENT DOCUMENTS

| 5,463,252 A | 10/1995 | Jones et al. | |
| 8,015,454 B1 * | 9/2011 | Harrison | G06F 16/21 714/47.3 |
| 8,391,363 B2 * | 3/2013 | Wu | H04N 19/172 375/240.16 |
| 9,735,725 B2 * | 8/2017 | Clendenen | H02H 3/023 |

(Continued)

FOREIGN PATENT DOCUMENTS

WO 14/053554 A1 4/2014

OTHER PUBLICATIONS

European Search Report, EP20188012, dated Nov. 20, 2020.

*Primary Examiner* — Andargie M Aychillhum
(74) *Attorney, Agent, or Firm* — Merchant & Gould P.C.

(57) ABSTRACT

A solid state circuit breaker assembly includes a transistor, a transient voltage suppression device, and a circuit board. The transistor and/or the transient voltage suppression device may be electrically connected to the circuit board. The solid state circuit breaker module may be configured to be connected to one or more non-scalable modules to regulate current. The solid state circuit breaker module may be configured to receive one or more scalable modules. The transistor and/or the transient voltage suppression device may be disposed on the circuit board in a substantially symmetrical configuration.

27 Claims, 8 Drawing Sheets

(56) References Cited

U.S. PATENT DOCUMENTS

| | | | |
|---|---|---|---|
| 2005/0133909 A1* | 6/2005 | Franca-Neto | H01Q 9/16 257/724 |
| 2013/0154391 A1* | 6/2013 | Urciuoli | H02M 1/32 307/112 |
| 2019/0179040 A1* | 6/2019 | Luu | G01T 1/2985 |

* cited by examiner

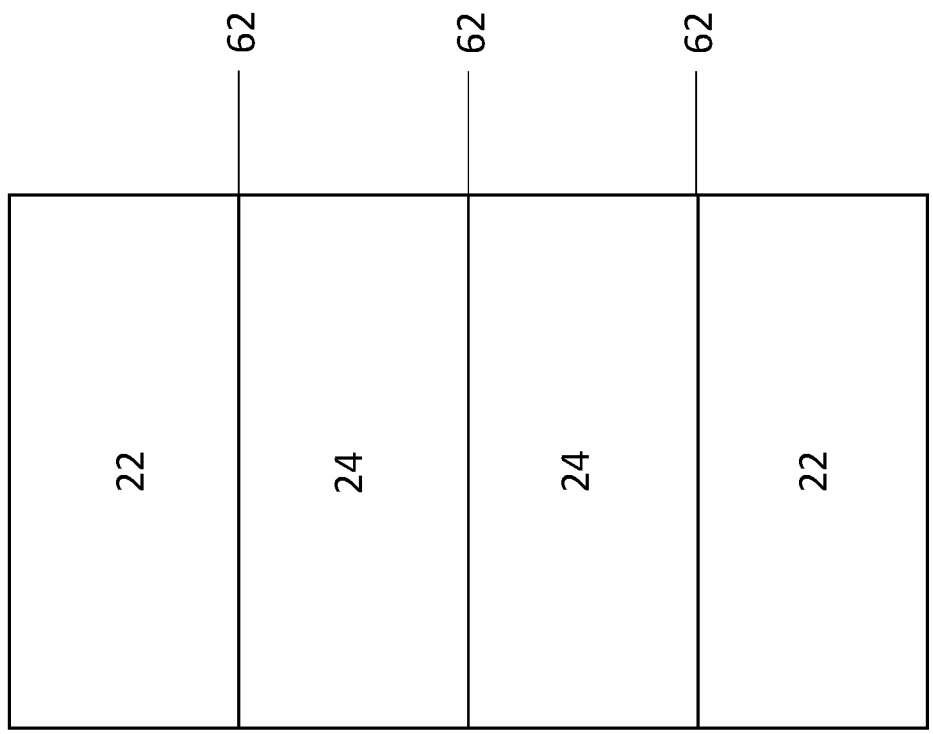
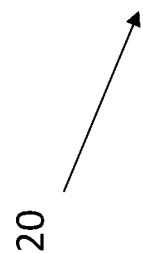
FIG. 1

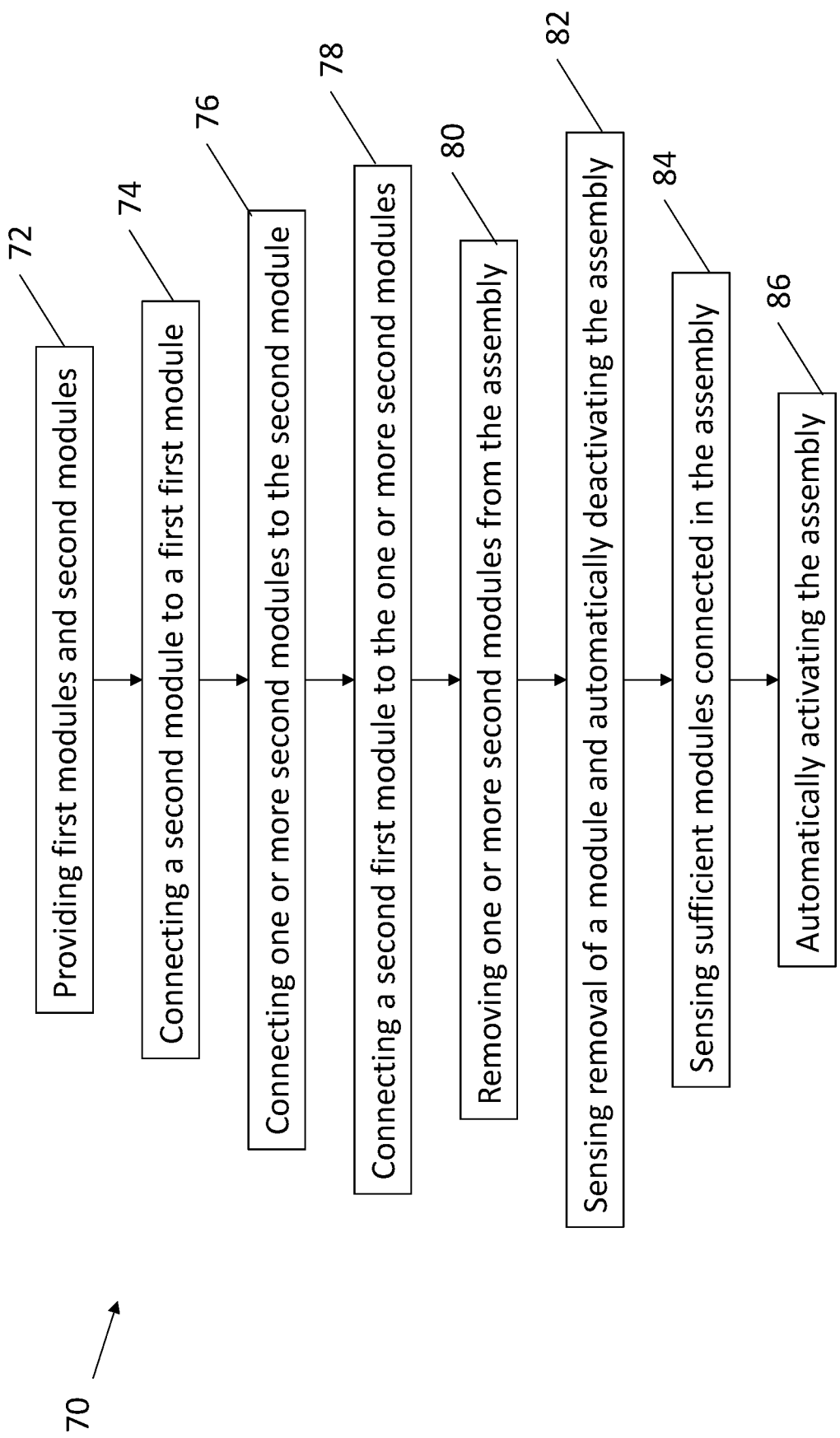

SOLID STATE CIRCUIT BREAKER ASSEMBLY

CROSS-REFERENCE TO RELATED APPLICATION

This application claims the benefit of U.S. Provisional Patent Application Ser. No. 62/878,969, filed on Jul. 26, 2019, the disclosure of which is hereby incorporated by reference in its entirety as though fully set forth herein.

TECHNICAL FIELD

The present disclosure generally relates to solid state circuit breaker assemblies, including solid state circuit breaker assemblies that may be used in connection with aircraft.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some solid state circuit breaker assemblies may not be sufficiently robust, may not be designed for a wide variety of applications, and/or may involve complex assembly processes.

There is a desire for solutions/options that minimize or eliminate one or more challenges or shortcomings of solid state circuit breaker assemblies. The foregoing discussion is intended only to illustrate examples of the present field and should not be taken as a disavowal of scope.

SUMMARY

In embodiments, a solid state circuit breaker module may include a transistor, a transient voltage suppression device, and/or a circuit board. The transistor and/or the transient voltage suppression device may be electrically connected to the circuit board. The solid state circuit breaker module may be configured to be connected to one or more non-scalable modules to regulate current. The solid state circuit breaker module may be configured to receive one or more scalable modules.

With embodiments, a solid state circuit breaker assembly may include a first non-scalable module, a second non-scalable module, and/or at least one scalable module. The first non-scalable module may include a controller and/or a current sensor. The current sensor may be directly connected to the controller. The second non-scalable module may include at least one contact that may be configured to be connected to a power supply. The scalable module may include a transistor, a transient voltage suppression device, and/or a circuit board. The circuit board may be electrically connected to the transistor and/or the transient voltage suppression device. The scalable module may be configured to be electrically and/or mechanically connected between the first non-scalable module and/or the second non-scalable module.

In embodiments, a method of assembling a solid state circuit breaker assembly may include providing a first non-scalable module that may include a controller and/or a current sensor. The method may include providing a second non-scalable module that may include at least one contact to connect to a power supply. The method may include providing at least one scalable module that may include a transistor, a transient voltage suppression device, and/or a circuit board. The method may include connecting the at least one scalable to the first non-scalable module, and/or connecting the second non-scalable module to the at least one scalable module. The transistor and the transient voltage suppression device may be electrically connected to the circuit board.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

FIG. 1 is a side view of an illustrative representation generally illustrating an embodiment of a solid state circuit breaker assembly according to teachings of the present disclosure.

FIG. 8 is a flowchart generally illustrating a method of assembling a solid state circuit breaker assembly according to teachings of the present disclosure.

DETAILED DESCRIPTION

Figure 2:
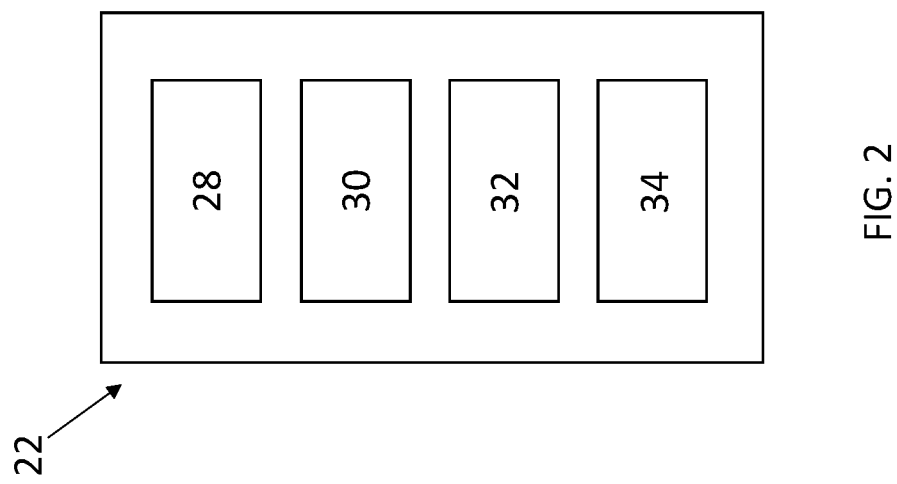
FIG. 2 is a diagrammatic view of portions of an embodiment of a first module according to teachings of the present disclosure.

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

In embodiments, such as generally illustrated in FIG. 1, a solid state circuit breaker assembly 20 may include one or more first modules 22 (which may also be referred to as a "non-scalable module(s)") and/or one or more second modules 24 (which may also referred to as a "scalable module(s)"). The first/non-scalable modules 22 and/or the second/scalable modules 24 may be connected (e.g., electrically and/or mechanically) to form the solid state circuit breaker assembly 20. The solid state circuit breaker assembly 20 may be configured to receive high current and/or high voltage. The solid state circuit breaker assembly 20 may be configured to disconnect a source 26 (e.g., a high-power source) from one or more electronic components if the voltage and/or current exceed a threshold current of the solid state circuit breaker assembly 20. One or more scalable modules 24 may be added to the solid state circuit breaker assembly 20 to increase current and/or voltage capacity of the solid state circuit breaker assembly 20.

In embodiments, such as generally illustrated in FIG. 1, a solid state circuit breaker assembly 20 may include two non-scalable modules 22 and/or one or more scalable modules 24. For example and without limitation, the one or more scalable modules 24 may be substantially positioned or disposed between the non-scalable modules 22. The solid state circuit breaker assembly 20 may be modular, such that one or more scalable modules 24 may be added and/or removed from the assembly 20 (e.g., the modules 22, 24 may be removed and/or added with minimal tools and/or effort). The solid state circuit breaker assembly 20 may comprise various numbers of scalable modules 24. An increase in the number of scalable modules 24 connected to the first modules 22 may increase (scale up) the voltage and/or current capability of the solid state circuit breaker assembly 20. For example and without limitation, connecting additional scalable modules 24 to the solid state circuit breaker assembly 20 may increase (e.g., as a function of the number of scalable modules 24) the voltage capacity of the solid state circuit breaker assembly 20.

With embodiments, a first non-scalable module 22 may be configured to receive high currents and/or high voltages. In embodiments, a first non-scalable module may be uniquely structured (e.g., sized) to provide for worst-case requirements, such as current/voltage carrying capability, as well as structural/mechanical requirements (e.g., vibration and shock). The first non-scalable module 22 may receive high currents and/or high voltages, and/or the first non-scalable module 22 may route the high current to the one or more scalable modules 24. The first non-scalable module 22 may connect the solid state circuit breaker assembly 20 to a source 26 (e.g., a voltage and/or a current source). The one or more first modules 22 may include one or more of a variety of electronic components. For example and without limitation, the one or more first modules 22 may include a controller 28, a current sensor 30, a gate driver 32, and/or one or more low voltage auxiliary power supplies 34 (see, e.g., FIG. 2).

Figure 3:
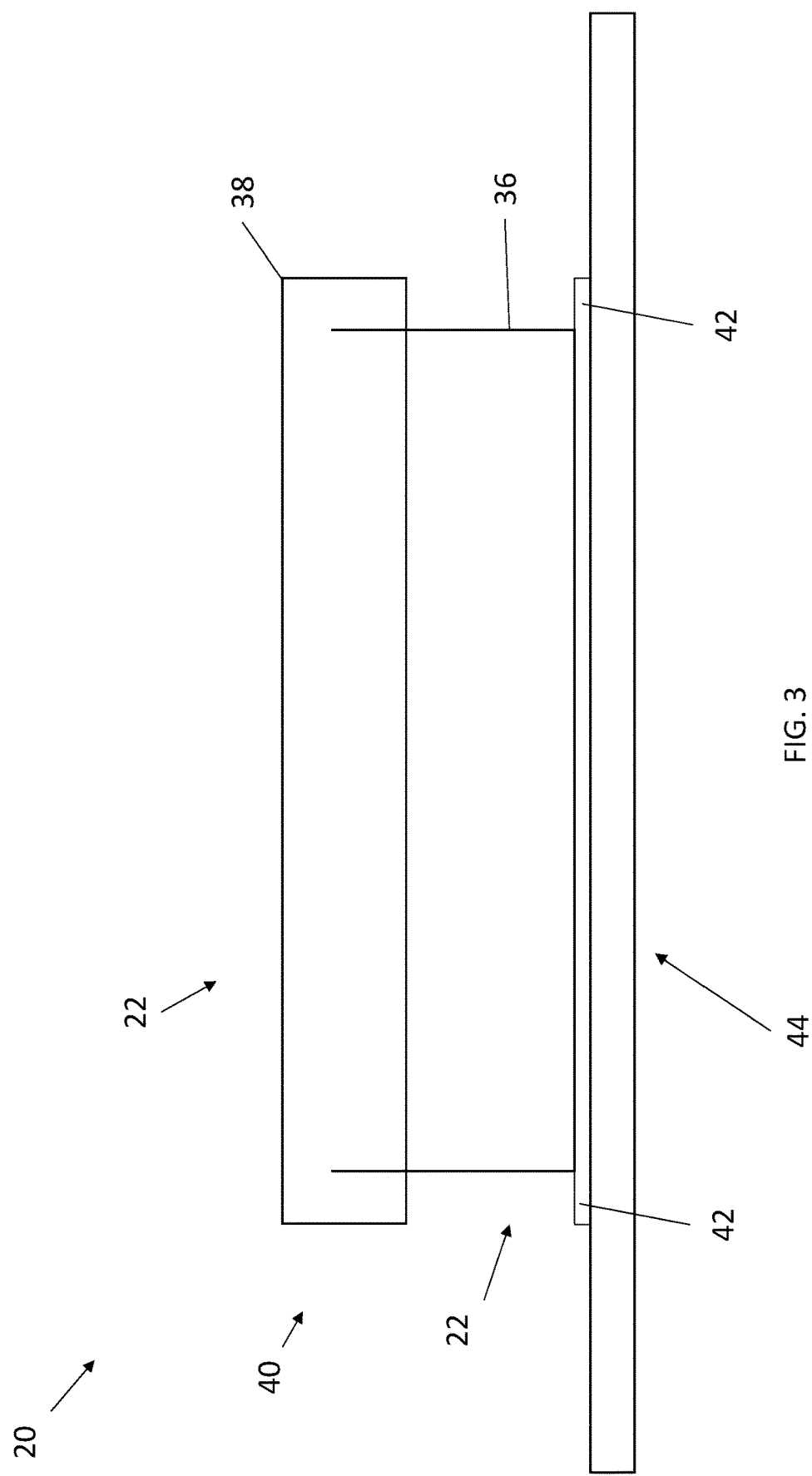
FIG. 3 is a side view of an illustrative representation generally illustrating an embodiment of a solid state circuit breaker according to teachings of the present disclosure.

In embodiments, a first non-scalable module 22 may be configured as a first portion 36 and/or a second portion 38 of a housing 40 of the solid state circuit breaker assembly 20. The first module 22 may protect components of the solid state circuit breaker assembly 20 from external interference (e.g., electrical and/or mechanical interference). The housing 40 may include one or more of a variety of materials, such as a polymer. The housing 40 may include one or more of a variety of shapes, sizes, and/or configurations. For example and without limitation, the first portion 36 of the housing 40 may be substantially cylindrical and/or box-shaped. The non-scalable module 22 may include one or more mounting portions 42 that may connect the solid state circuit breaker assembly 20 to a mounting surface 44 (e.g., a portion of an aircraft and/or an electrical component frame, such as illustrated in FIG. 3). The one or more mounting portions 42 may include one or more fasteners, connectors, and/or apertures to sufficiently secure (e.g., limit movement in at least one direction) the solid state circuit breaker assembly 20 to the mounting surface 44. The mounting portions 42 may be disposed at or about a periphery of the housing 40.

With embodiments, at least one of the non-scalable modules 22 may be configured as a cover (e.g., a second portion of the housing 38 may serve as a cover) and/or a connector assembly. A non-scalable module 22 may be connected to another non-scalable module 22 to form the housing 40 of the solid state circuit breaker assembly 20. For example and without limitation, a first non-scalable module 22 may include a first portion 36 of the housing 40 and/or another second non-scalable module 22 may include a second portion 38 (e.g., a cover) of the housing 40. One or more scalable modules 24 may be disposed between the non-scalable modules 22. The non-scalable modules 22 (e.g., the first housing portion 36 and/or the second hosing portion 38) may be configured to protect and/or isolate the scalable modules 24 from electrical and/or mechanical interference.

Figure 4:
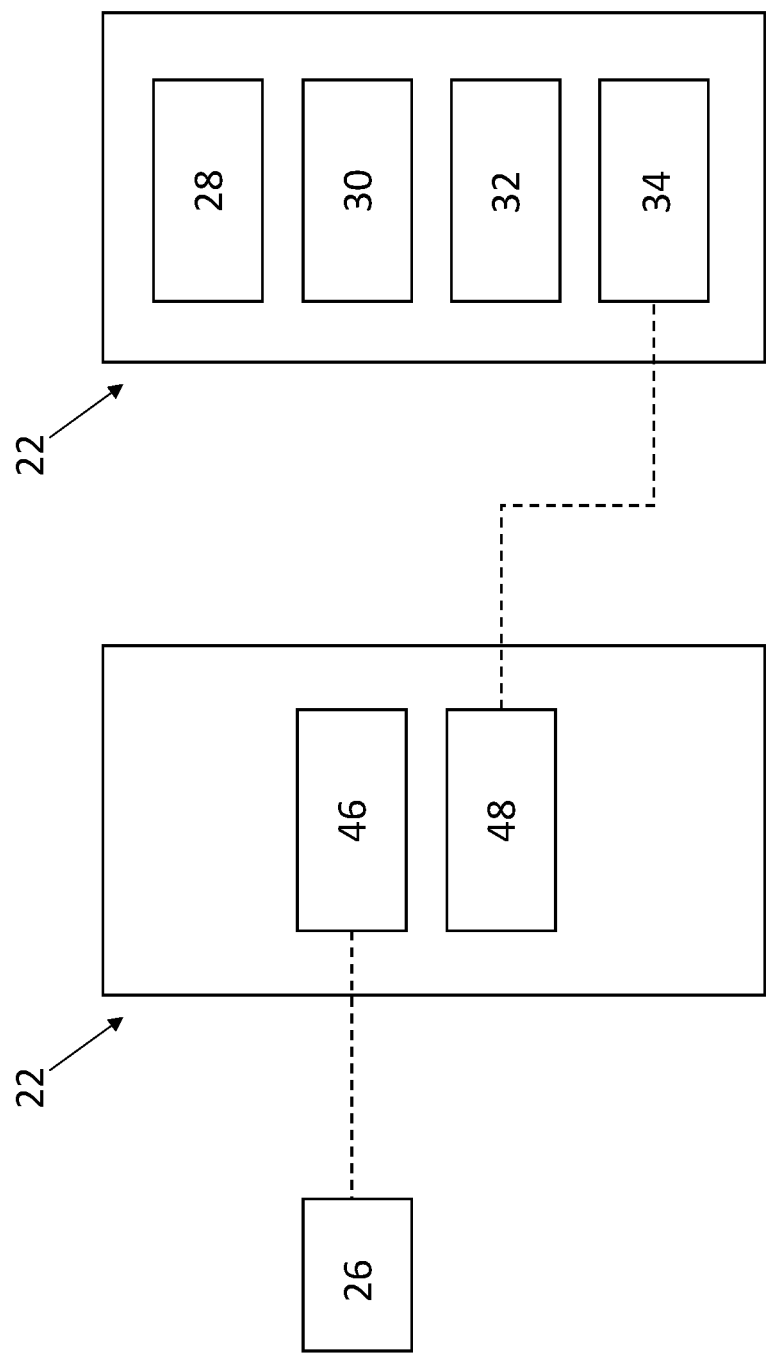
FIG. 4 is a diagrammatic view generally illustrating embodiments of first modules according to teachings of the present disclosure.

In embodiments, such as generally illustrated in FIG. 4, the non-scalable module 22 may include one or more terminals 46 for receiving high voltage and/or high current (e.g., the non-scalable module 22 may be connected to a power source 26 to be managed by the solid state circuit breaker assembly 20). The non-scalable module 22 may include a connector 48 that may be configured to connect with the low voltage power supply 34 of another first module 22. One or more auxiliary components may be connected to the non-scalable module 22 to facilitate monitoring of the solid state circuit breaker assembly 20. For example and without limitation, in embodiments, a single non-scalable module 22 may be connected with one or more scalable modules 24. A single non-scalable module 22 may include a controller 28, a current sensor 30, a gate driver 32, a power supply 34, a housing 40, and/or a connector 48 (e.g., a single non-scalable module 22 may be used instead of a first non-scalable module 22 and a second non scalable 22 module). The scalable modules 24 may be connected and/or assembled with (e.g., connected on top) of the non-scalable module 22 (e.g., stacked).

Figure 5:
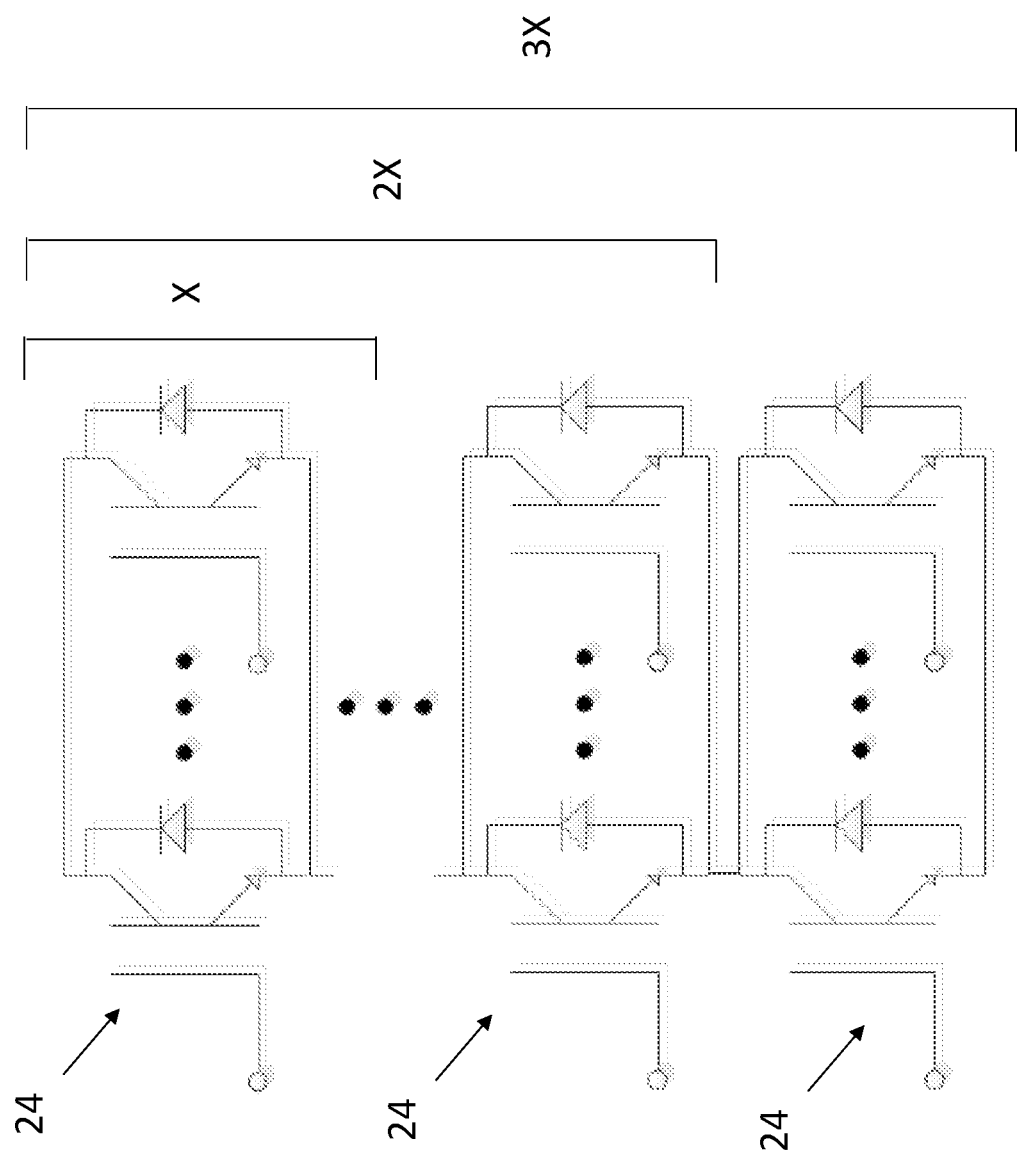
FIG. 5 is a schematic diagram generally illustrating an embodiment of scalable modules according to teachings of the present disclosure.

In embodiments, the solid state circuit breaker assembly 20 may include one or more scalable modules 24. The scalable modules 24 may be configured to operate in conjunction with the non-scalable modules 22 as the circuit breakers of the solid state circuit breaker assembly 20. Any number of scalable modules 24 may be added to the solid state circuit breaker assembly 20 to increase the voltage capacity of the assembly 20 (such as electrical design constraints may permit). Similarly, one or more scalable modules 24 may be electrically disconnected and/or removed from the solid state circuit breaker assembly 20 to reduce the voltage capacity of the assembly 20. The scalable modules 24 may be configured to incrementally increase the voltage rating of the solid state circuit breaker assembly 20. For example and without limitation, the one or more scalable modules 24 may be substantially identical. Each scalable module 24 may include a voltage carrying capacity X and/or a current carrying capacity Y. Such as generally illustrated in FIG. 5, if two scalable modules 24 are connected to the solid state circuit breaker assembly 20, the voltage capacity of the assembly 20 may be 2×(e.g., twice the capacity of a single scalable module 24). Similarly, if three scalable modules 24 are connected to the solid state circuit breaker assembly 20, the voltage capacity of the assembly 20 may be 3×(see, e.g., FIG. 5). The voltage capacity of the assembly 20 may be equal to the voltage rating of a single scalable module 24 multiplied by the number of scalable modules 24 electrically connected to the non-scalable modules 22. In embodiments, the scalable modules 24 may be configured to manage an alternating current supply of 230 volts and/or a direct current supply of about 1,000 volts or more or less.

Figure 6:
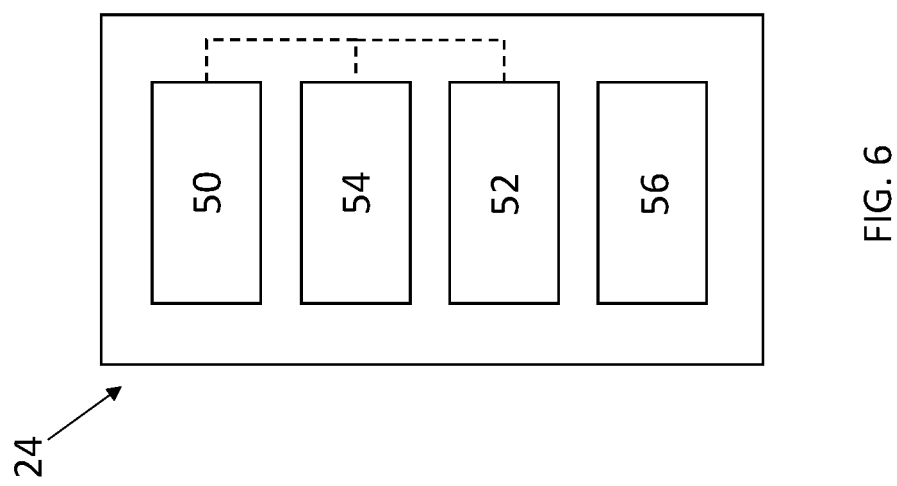
FIG. 6 is a diagrammatic view generally illustrating portions of a scalable module according to teachings of the present disclosure.

With embodiments, such as generally illustrated in FIG. 6, one or more scalable modules 24 may include a transistor 50 (e.g., a MOSFET, JFET, bipolar junction transistor, etc.), a transient voltage suppression device 52, a circuit board 54, and/or a heat sink 56. The transistors 50, transient voltage suppression devices 52, and/or heat sinks 56 may be connected to the circuit board 54 of the scalable module 24. The heat sink 56 may be a function of the structure of the scalable module 24. For example and without limitation, the structure of the scalable module 24 may be configured such as to sufficiently dissipate heat from the scalable module 24 during operation of the solid state circuit breaker assembly 20. Additionally or alternatively, the circuit board 54 may include heat sinks 56 connected to a surface of the circuit board 54. Each scalable module 24 may include any number of transistors 50, transient voltage suppression devices 52, and/or heat sinks 56. For example and without limitation, increasing the number of the transistors 50 and/or the transient voltage suppression devices 52 may increase the current carrying capability of each scalable module 24.

In embodiments, each scalable module 24 may include a current carrying capacity Y. The current carrying capacity Y of each scalable module 24 may be dependent on the number of transistors 50 and/or transient voltage suppression devices 52 connected to the circuit board 54 of the scalable module 24. For example and without limitation, a scalable module 24 with twice the number of transistors 50 and/or voltage suppression devices 52 may be configured such that the scalable module 24 may include a current capacity of 2Y (e.g., twice the current capacity). To increase the current carrying capacity of the one or more scalable modules 24, the quantity of transistors 50 and transient voltage suppression devices 52 connected to the circuit board 54 may be increased.

Figure 7:
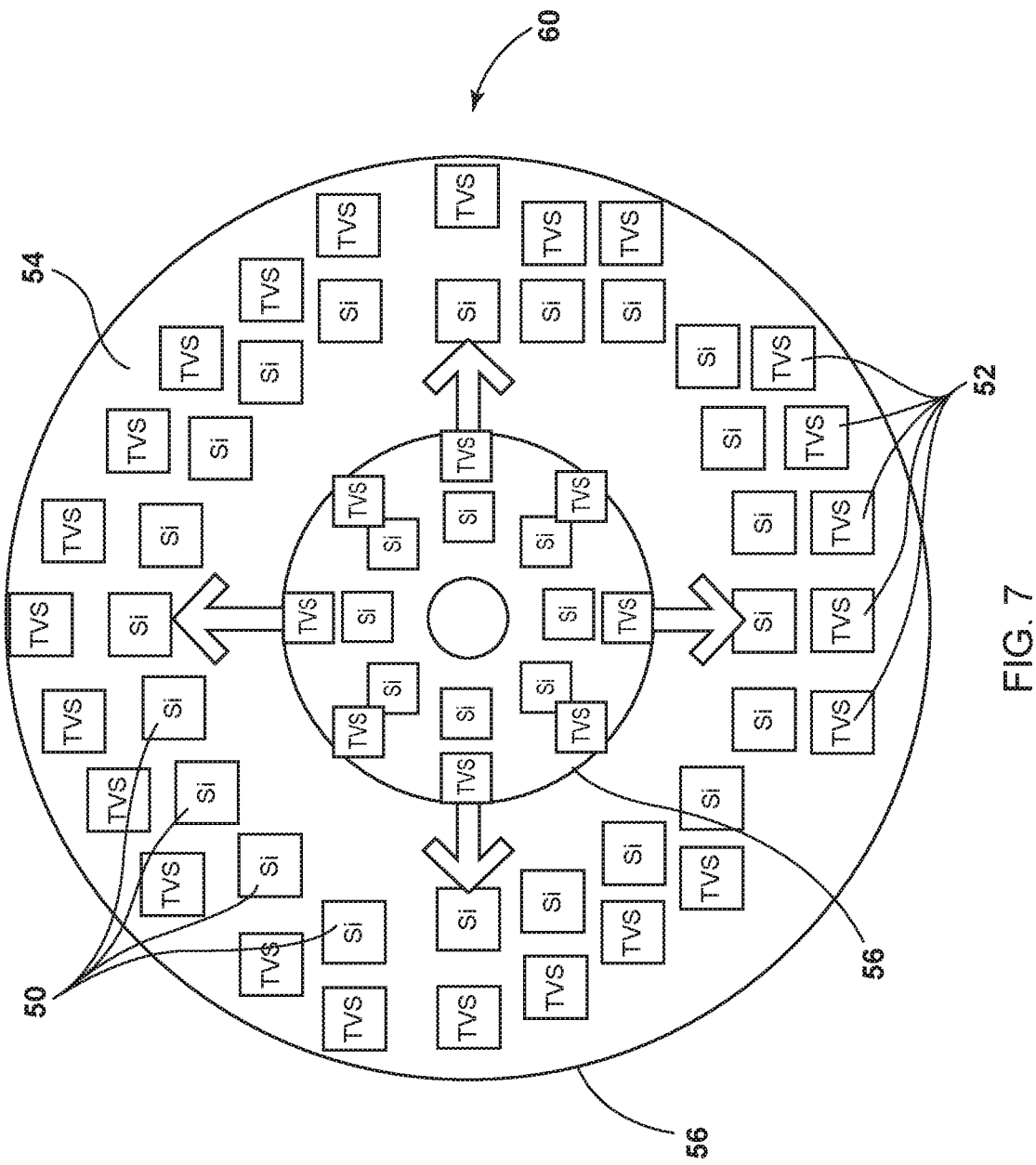
FIG. 7 is a top view generally illustrating portions of a scalable module according to teachings of the present disclosure.

With embodiments, each scalable module 24 may be configured to include the same quantity of transistors 50 and/or transient voltage suppression devices 52 to facilitate modular scaling of the assembly 20. Including the same quantity of transistors 50 and/or transient voltage suppression devices 52 may facilitate modular scaling such that adding sequential scalable modules 54 incrementally increases the current capacity by a constant magnitude. In embodiments, transistors 50 and/or the transient voltage suppression devices 52 may be disposed symmetrically on the circuit board 54 such as to limit differences in connection length to each transistor 50 and/or each transient voltage suppression device 52 (e.g., see FIG. 7). For example and without limitation, a first side 58 of the circuit board 54 may include the same number of transistors 50 and/or transient voltage suppression devices 52 as a second side 60 of the circuit board 54. The transistors 50 and/or the transient voltage suppression devices 52 may be disposed on the circuit board 54 in a substantially circular pattern (see, e.g., FIG. 7).

In embodiments, one or more non-scalable modules 22 and/or one or more scalable modules 24 may be removed and/or added to the solid state circuit breaker assembly 20 while the assembly may be active (e.g., while the non-scalable module 22 may be connected to the source 26). The controller 28 in the non-scalable module 22 may be configured to sense when a non-scalable module 22 and/or a scalable module 24 may be removed from the solid state circuit breaker assembly 20. The controller 28 may be configured to automatically deactivate (e.g., momentarily disconnect) the solid state circuit breaker assembly 20 upon sensing the removal of a non-scalable module 22 and/or a scalable module 24. The controller 28 may disconnect the non-scalable modules 22 from the source (e.g., the power supply 26). The controller 28 may sense whether the solid state circuit breaker assembly 20 is sufficiently connected before activating/re-activating the assembly 20.

With embodiments, the controller 28 of the non-scalable module 22 may be configured to sense the number of scalable modules 24 connected to the solid state circuit breaker assembly 20. If the controller 28 determines that the number of scalable modules 24 connected to the assembly 20 exceeds a maximum design threshold, the controller 28 may not permit operation of the solid state circuit breaker assembly 20. Once the proper number of scalable modules 24 are connected in the assembly 20, the controller 28 may permit operation of the solid state circuit breaker assembly 20.

In embodiments, the one or more non-scalable modules 22 and/or the one or more scalable modules 24 may be electrically and/or physically connected to one another. In embodiments, modules 22, 24 may be electrically connected via contacts 62 on an outer portion of the modules 22, 24 (see, e.g., FIG. 1). For example and without limitation, each module 22, 24 may include one or more contacts 62 to facilitate electrical connection between modules 22, 24. The one or more contacts 62 may be configured as a threaded connection. The modules 22, 24 may be connected to other modules 22, 24 via a snap connection (e.g., the contacts 62 between the modules 22, 24 may be configured to snap together and/or compress to provide an electrical connection between modules 22, 24). When connecting and/or disconnecting modules 22, 24 from the solid state circuit breaker assembly 20, the modules 22, 24 may be separated and/or pushed together until the contacts 62 disengage and/or engage (e.g., via a snap fit connection). For example and without limitation, if one or more of the scalable modules 24 are not functioning properly, the one or more scalable modules 24 may be easily replaced without disconnecting the solid state circuit breaker assembly 20 from the power source 26 (e.g., modules 22, 24 may be swapped while the circuit is active/hot).

With embodiments, such as generally illustrated in FIG. 8, a method 70 of assembling a solid state circuit breaker assembly 20 may include providing a first non-scalable module 22 (e.g., a housing/controller module) that may include a controller 28 and/or a current sensor 30 (step 72). The method may include providing a second non-scalable module 22 (e.g., a cover/connector module) that may include at least one contact 46 to connect to a power supply 26 (step 72). The method may include providing at least one scalable module 24 (step 72). The scalable module 24 may include a transistor 50, a transient voltage suppression device 52, a circuit board 54, and/or a heat sink 56. The method may include connecting the at least one scalable module 24 to the first non-scalable module 22 (step 74). The method may include connecting one or more additional scalable modules 24 to the scalable module 24 (step 76), and/or connecting the second non-scalable module 22 to the at least one or more scalable modules 24 (step 78). Connecting the non-scalable modules 22 and the scalable modules 24 may include stacking the modules 22, 24. Connecting additional scalable modules 24 to the non-scalable modules 22 may increase a voltage capacity of the solid state circuit breaker assembly 20. The method may include removing one or more modules 22, 24 from the assembly 20 without deactivating (e.g., manually) the assembly 20 (step 80). The method may include sensing the removal of one or more modules and automatically deactivating the assembly 20 (step 82). The method may include replacing and/or adding modules 22, 24 to the assembly 20 and/or the assembly 20 may automatically activate when a sufficient number of modules 22, 24 are connected (step 84 and 86).

In embodiments, an advantage to utilizing scalable modules 24 may be cost reduction. Core components of a product family may be shared while the scalable modules 24 may be utilized in different quantities and/or sizes to increase and/or decrease the voltage and/or current rating. The reduction in distinctive components may reduce development expenses and/or reduce procurement costs due to higher quantities. Among other things, cost savings may be gained over the life of the protection device in cases of repairs and/or management since the failed modules 22, 24 may be replaced independently. An additional benefit of scalable modules 24 may be shared and/or reduced certification cost and/or documentation and procedures.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

What is claimed is:

1. A solid state circuit breaker module, comprising:
a transistor;
a transient voltage suppression device; and
a circuit board;
wherein the transistor and the transient voltage suppression device are electrically connected to the circuit board; the solid state circuit breaker module is configured to be connected to one or more first non-scalable modules to regulate current; the one or more first non-scalable modules each include a controller; the controller is configured to automatically deactivate the solid state circuit breaker module upon sensing removal of the one or more first non-scalable modules; and the solid state circuit breaker module is configured to receive one or more scalable modules.

2. The solid state circuit breaker module of claim 1, wherein the transistor and the transient voltage suppression device are disposed on the circuit board in a substantially symmetrical configuration.

3. The solid state circuit breaker module of claim 1, wherein the transistor comprises a MOSFET, a JFET, or a bipolar junction transistor.

4. The solid state circuit breaker module of claim 1, wherein the circuit board includes a first side and a second side, and the first side of the circuit board is connected to the same number of transistors or the same number of transient suppression devices as the second side of the circuit board.

5. The solid state circuit breaker module of claim 1, wherein the circuit board includes a first side and a second side, and the first side of the circuit board is connected to the same number of transistors and transient suppression devices as the second side of the circuit board.

6. The solid state circuit breaker module of claim 1, wherein the one or more scalable modules are added to increase the voltage and/or current capacity of the solid state circuit breaker module.

7. The solid state circuit breaker module of claim 1, wherein the one or more first non-scalable modules further include a current sensor.

8. The solid state circuit breaker module of claim 1, wherein the one or more first non-scalable modules further include a gate driver.

9. The solid state circuit breaker module of claim 1, wherein the one or more first non-scalable modules further include one or more low voltage power supplies.

10. The solid state circuit breaker module of claim 1, wherein the one or more scalable modules each include an additional transistor, and/or a heat sink.

11. The solid state circuit breaker module of claim 1, wherein the one or more scalable modules each include an additional transient voltage suppression device.

12. The solid state circuit breaker module of claim 1, wherein the one or more scalable modules each include a heat sink.

13. The solid state circuit breaker module of claim 1, wherein the one or more first non-scalable modules further include a current sensor, a gate driver, and one or more low voltage power supplies.

14. The solid state circuit breaker module of claim 1, wherein the one or more scalable modules each include an additional transistor, an additional transient voltage suppression device, and a heat sink.

15. A solid state circuit breaker assembly, comprising:
   a first non-scalable module including:
      a controller; and
      a current sensor electrically connected to the controller;
   a second non-scalable module including at least one contact configured to be connected to a power supply; and
   at least one scalable module including:
      a transistor;
      a transient voltage suppression device; and
      a circuit board electrically connected to the transistor and the transient voltage suppression device;
   wherein the at least one scalable module is configured to be electrically and mechanically connected between the first non-scalable module and the second non-scalable module; and
   wherein the controller is configured to automatically deactivate the solid state circuit breaker assembly upon sensing removal of the first and second non-scalable modules.

16. The solid state circuit breaker assembly of claim 15, wherein the first non-scalable module, the second non-scalable module, and the at least one scalable module are configured to be modular such that additional scalable modules are configured to be connected to the solid state circuit breaker assembly between the first non-scalable module and the second non-scalable module.

17. The solid state circuit breaker assembly of claim 15, wherein the at least one scalable module may be stacked substantially between the first non-scalable module and the second non-scalable module.

18. The solid state circuit breaker assembly of claim 15, wherein the first non-scalable module is configured to connect to the at least one scalable module via one or more snap-fit contactors.

19. The solid state circuit breaker assembly of claim 15, wherein the first non-scalable module includes a first portion of a housing; the second non-scalable module includes a second portion of the housing; the first portion of the housing is configured to connect to the second portion of the housing to form the housing and to shield the at least one scalable module from interference.

20. The solid state circuit breaker assembly of claim 15, wherein the first non-scalable module, the second non-scalable module, and the at least one scalable module are configured to be electrically disconnected from the solid state circuit breaker assembly without disconnecting the solid state circuit breaker assembly from the power supply.

21. The solid state circuit breaker assembly of claim 15, wherein the controller disconnects the second non-scalable module from the power supply.

22. A method of assembling a solid state circuit breaker assembly, including:
   providing a first non-scalable module including a controller and a current sensor;
   providing a second non-scalable module including at least one contact to connect to a power supply;
   providing at least one scalable module including a transistor, a transient voltage suppression device, and a circuit board;
   connecting the at least one scalable module to the first non-scalable module; and
   connecting the second non-scalable module to the at least one scalable module;
   wherein the transistor and the transient voltage suppression device are electrically connected to the circuit board; and
   wherein the controller is configured to automatically deactivate the solid state circuit breaker assembly upon sensing removal of the first and second non-scalable modules.

23. The method of claim 22, including connecting one or more additional scalable modules between the first non-scalable module and the second non-scalable module.

24. The method of claim 22, including connecting a plurality of scalable modules between the first non-scalable module and the second non-scalable module.

25. The method of claim 24, wherein the plurality of scalable modules provides a desired voltage capacity for the solid state circuit breaker assembly.

26. The method of claim 22, wherein the controller disconnects the second non- scalable module from the power supply.

27. A solid state circuit breaker assembly, comprising:
   a first non-scalable module including:
      a controller; and
      a current sensor electrically connected to the controller;
   a second non-scalable module including at least one contact configured to be connected to a power supply; and
   at least one scalable module including:
      a transistor;
      a transient voltage suppression device; and
      a circuit board electrically connected to the transistor and the transient voltage suppression device;
   wherein the at least one scalable module is configured to be electrically and mechanically connected between the first non-scalable module and the second non-scalable module; and
   wherein the first non-scalable module includes a first portion of a housing, the second non-scalable module includes a second portion of the housing, and the first portion of the housing is configured to connect to the second portion of the housing to form the housing and to shield the at least one scalable module from interference.

* * * * *